(12) United States Patent
Kim

(10) Patent No.: US 10,978,435 B2
(45) Date of Patent: Apr. 13, 2021

(54) DISPLAY DEVICE USING SEMICONDUCTOR LIGHT-EMITTING ELEMENT

(71) Applicant: LG ELECTRONICS INC., Seoul (KR)

(72) Inventor: Seonhoo Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/479,483

(22) PCT Filed: Apr. 25, 2017

(86) PCT No.: PCT/KR2017/004386
§ 371 (c)(1),
(2) Date: Jul. 19, 2019

(87) PCT Pub. No.: WO2018/135704
PCT Pub. Date: Feb. 6, 2018

(65) Prior Publication Data
US 2019/0385991 A1    Dec. 19, 2019

(30) Foreign Application Priority Data

Jan. 20, 2017  (KR) .................. 10-2017-0009824

(51) Int. Cl.
*H01L 27/32*        (2006.01)
*H01L 25/075*       (2006.01)
(Continued)

(52) U.S. Cl.
CPC ........ *H01L 25/167* (2013.01); *H01L 25/0753* (2013.01); *H01L 33/20* (2013.01); *H01L 33/32* (2013.01); *H01L 33/62* (2013.01)

(58) Field of Classification Search
CPC . H01L 25/167; H01L 25/075; H01L 25/0753; H01L 33/20; H01L 33/32;
(Continued)

(56) References Cited

U.S. PATENT DOCUMENTS 9,991,240 B2 * 6/2018 Jeong ................... H01L 33/58
2011/0273410 A1  11/2011 Park et al.
(Continued)

FOREIGN PATENT DOCUMENTS

CN          103560140 A     2/2014
CN          105324858 A     2/2014
(Continued)

*Primary Examiner* — Natalia A Gondarenko
(74) *Attorney, Agent, or Firm* — Birch, Stewart, Kolasch & Birch, LLP

(57) ABSTRACT

The present invention relates to a display device using a semiconductor light-emitting element and, particularly, to a display device using a semiconductor light-emitting element. A display device according to the present invention comprises: a substrate including a driving thin-film transistor; a semiconductor light-emitting element including a first conductive electrode and a second conductive electrode; and a planarization layer formed to cover the driving thin-film transistor and including a reception hole in which the semiconductor light-emitting element is received, wherein a height adjustment layer is formed between the substrate and the planarization layer so as to make one of the first and the second conductive electrode and one surface of the planarization layer coincide with each other in height.

10 Claims, 14 Drawing Sheets

(51) Int. Cl.
*H01L 25/16* (2006.01)
*H01L 33/20* (2010.01)
*H01L 33/32* (2010.01)
*H01L 33/62* (2010.01)

(58) Field of Classification Search
CPC ......... H01L 33/36; H01L 33/62; H01L 27/12; H01L 27/1251; H01L 27/1214; H01L 27/1225; H01L 27/1222; H01L 27/124; H01L 27/1248; H01L 27/15; H01L 27/153; H01L 33/08; H01L 33/18; H01L 33/38; H01L 33/40; H01L 33/405; H01L 33/42; H01L 33/44; H01L 33/46; H01L 33/48; H01L 33/486; H01L 33/52; H01L 33/56; H01L 33/58; H01L 33/60; H01L 51/5271; H01L 51/5293; H01L 51/5284; H01L 51/5036; H01L 33/54; H01L 27/1218; H01L 27/127; H01L 27/156; H05B 33/12
USPC ..... 257/72, 88, 89, 98, 99, 100; 438/26, 127
See application file for complete search history.

(56) References Cited

U.S. PATENT DOCUMENTS

2014/0367705 A1* 12/2014 Bibl ........................ H01L 33/60
257/88
2015/0084054 A1   3/2015 Fan et al.
2015/0115293 A1*  4/2015 Wu ........................ H01L 24/24
257/88
2017/0294451 A1* 10/2017 Kim ...................... H01L 27/124
2019/0080649 A1*  3/2019 Lee .................... H01L 29/78645

FOREIGN PATENT DOCUMENTS

| KR | 10-1058880 B1 | 8/2011 |
| KR | 10-2013-0092893 A | 8/2013 |
| KR | 10-2013-01379985 A | 12/2013 |
| KR | 10-2015-0119149 A | 10/2015 |
| KR | 10-2016-0010537 A | 1/2016 |

* cited by examiner

DISPLAY DEVICE USING SEMICONDUCTOR LIGHT-EMITTING ELEMENT

CROSS REFERENCE TO RELATED APPLICATIONS

This application is the National Phase of PCT International Application No. PCT/KR2017/004386, filed on Apr. 25, 2017, which claims priority under 35 U.S.C. 119(a) to Patent Application No. 10-2017-0009824, filed in the Republic of Korea on Jan. 20, 2017, all of which are hereby expressly incorporated by reference into the present application.

BACKGROUND OF THE INVENTION

1. Field of the Invention

The present disclosure relates to a display device, and more particularly, to a display device using a semiconductor light-emitting element.

2. Description of the Conventional Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light-emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a display, thereby presenting a scheme for solving the problems.

Therefore, in recent years, research and development on a display device using micro semiconductor light-emitting elements has been carried out, and such a display device has attracted attention as a next generation display because of its high image quality and high reliability. However, since such a display device uses micro light-emitting elements, there is a problem that luminous efficiency and contrast are deteriorated when phosphors, wirings, and the like are exposed to the outside.

Accordingly, the present disclosure proposes a new structure of a display device capable of enhancing optical performance based on semiconductor light-emitting elements having a size of several to several tens of micrometers. Moreover, a panel structure capable of improving the wiring process in a new structure of a display device is presented.

SUMMARY OF THE INVENTION

An aspect of the present disclosure is to provide a structure capable of reducing a period of time required for a process for connecting light-emitting elements to a circuit in a display device using semiconductor light-emitting elements.

Another aspect of the present invention is to provide a display device having a structure capable of securing manufacturing reliability and reducing manufacturing cost.

A display device according to the present disclosure may apply a structure capable of adjusting a height of a semiconductor light-emitting element in a chip in cup (CIC) in which a semiconductor light-emitting element is accommodated in a cup-shaped receiving hole, thereby further facilitating wiring process.

For a specific example, the display device may include a substrate having a driving thin-film transistor, a semiconductor light-emitting element having a first conductive electrode and a second conductive electrode, and a planarization layer formed to cover the driving thin-film transistor, and provided with a receiving hole for accommodating the semiconductor light-emitting element, wherein a height adjustment layer is formed between the substrate and the planarization layer to match a height of one surface of the substrate to either one of the first conductive electrode and the second conductive electrode.

According to an embodiment, the semiconductor light-emitting element may be higher in height than the planarization layer. The height adjustment layer may be formed on the substrate to adjust a distance from the substrate to an upper surface of the planarization layer.

In addition, the height adjustment layer may perform the role of reflecting light. To this end, the height adjustment layer may be provided with resin and reflective particles mixed into the resin.

According to an embodiment, an insulating layer covering the driving thin-film transistor may be formed on the substrate, and the planarization layer may include photo acryl coated to cover the insulating layer. The receiving hole may pass through the planarization layer, the insulating layer, and the height adjustment layer, respectively, such that an upper surface of the substrate forms a bottom of the receiving hole. The planarization layer may form a plurality of layers with the same material by coating the photo acryl a plurality of times.

According to an embodiment, a first conductive semiconductor layer of the semiconductor light-emitting element may be smaller in thickness than a second conductive semiconductor layer. A thickness of the second conductive semiconductor layer may be greater than that of the planarization layer.

In a display device according to the present disclosure, semiconductor light-emitting elements may be disposed in receiving holes on a planarization layer, thereby separating pixels by partition walls. As semiconductor light-emitting elements are electrically connected to wiring in receiving holes, the alignment of the semiconductor light-emitting elements may be facilitated, thereby allowing the high-precision manufacture of a display device.

In addition, according to the present disclosure, a step between transferred semiconductor light-emitting elements and the planarization layer may be removed through a height adjustment layer, thereby facilitating the electrode connecting process, and improving the panel yield.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
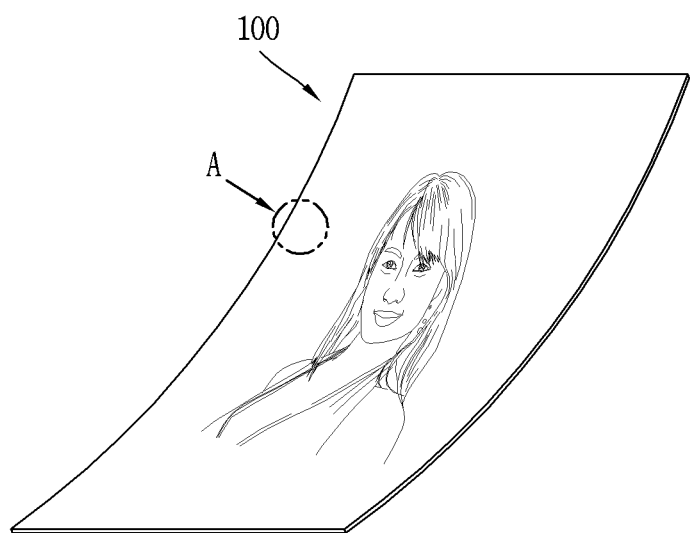
FIG. 1 is a conceptual view illustrating a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light-emitting element. According to the present disclosure, a light emitting diode (LED) is illustrated as a type of semiconductor light-emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
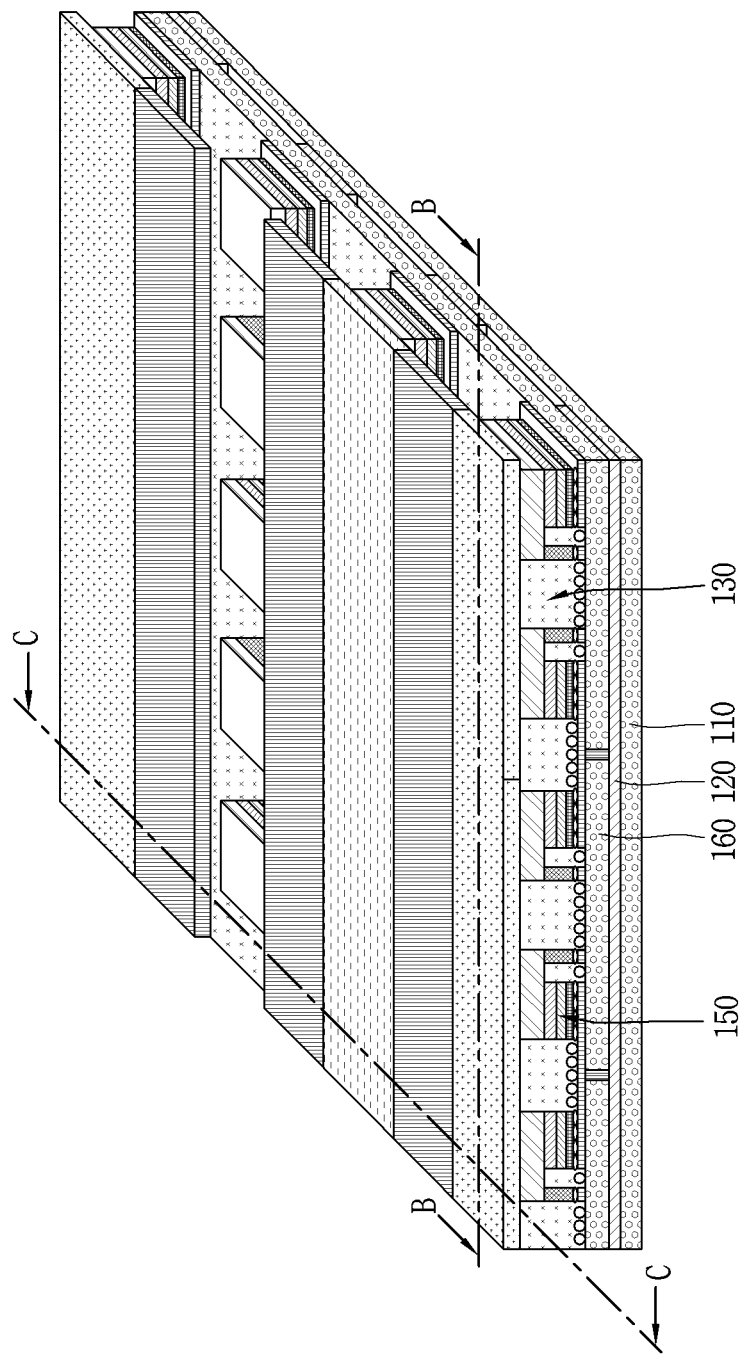
FIG. 2 is a partial enlarged view of portion "A" in FIG. 1, and FIGS. 3A and 3B are cross-sectional views taken along lines B-B and C-C in FIG. 2.
Figure 3A:
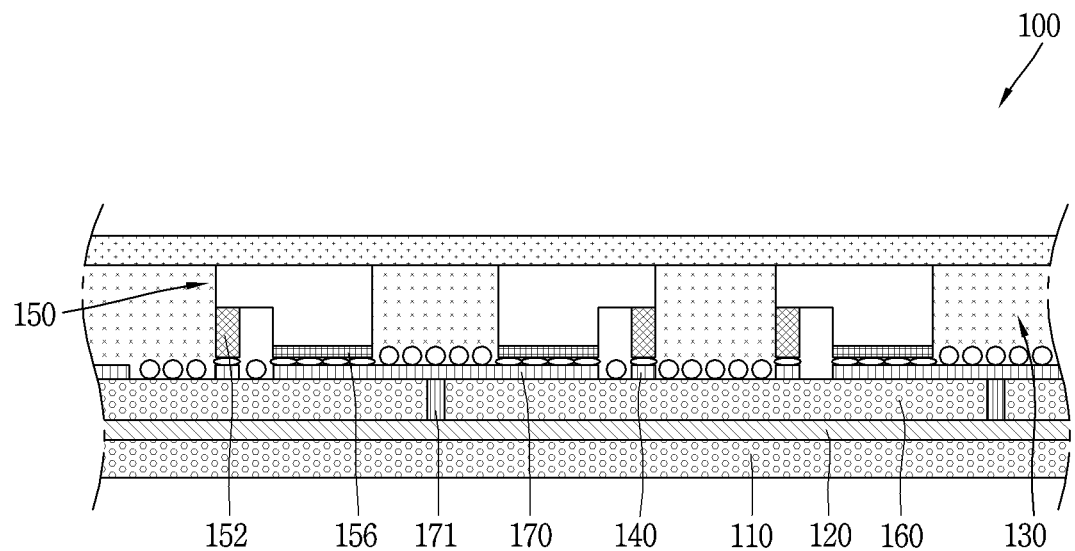
Figure 3B:
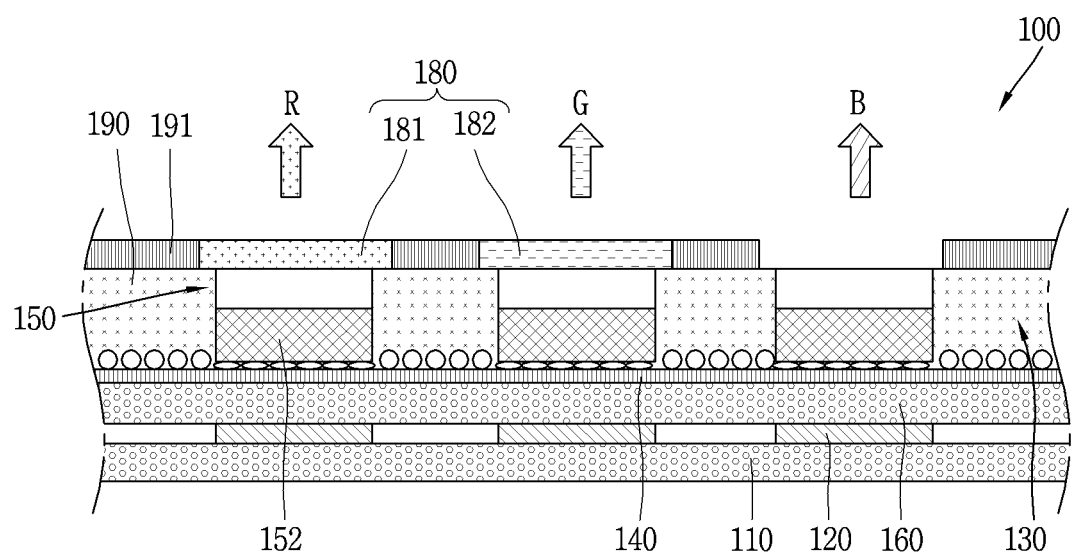
Figure 4:
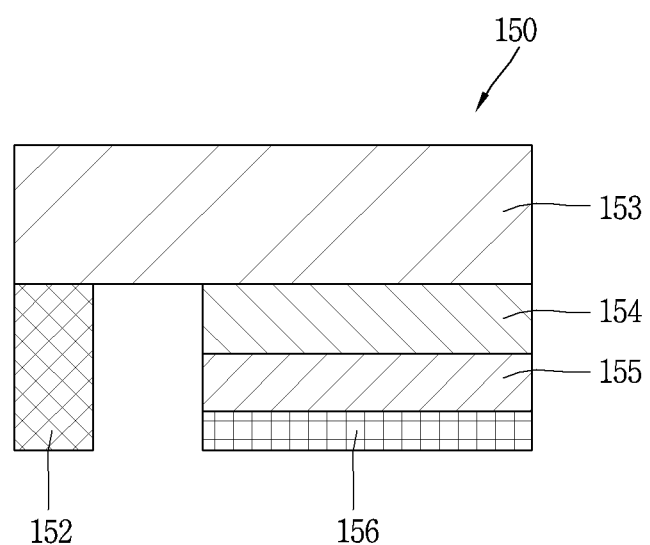
FIG. 4 is a conceptual view illustrating a flip-chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element. However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting element array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 has an excellent luminance characteristic, and thus it may be possible to configure individual sub-pixels even with a small size thereof.

According to the drawing, a partition wall 190 may be formed between the semiconductor light-emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a location implementing a red sub-pixel, and a green phosphor 182 capable of converting blue light into green (G) light may be deposited on the blue semiconductor light-emitting element 151 at a location implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
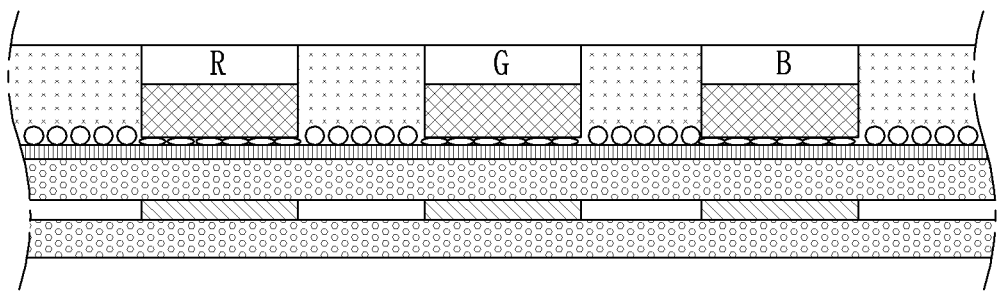
FIGS. 5A through 5C are conceptual views illustrating various forms for implementing colors in connection with a flip-chip type semiconductor light-emitting element.

Referring to FIG. 5A, each of the semiconductor light-emitting elements 150 may be implemented with a high-power light-emitting element that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
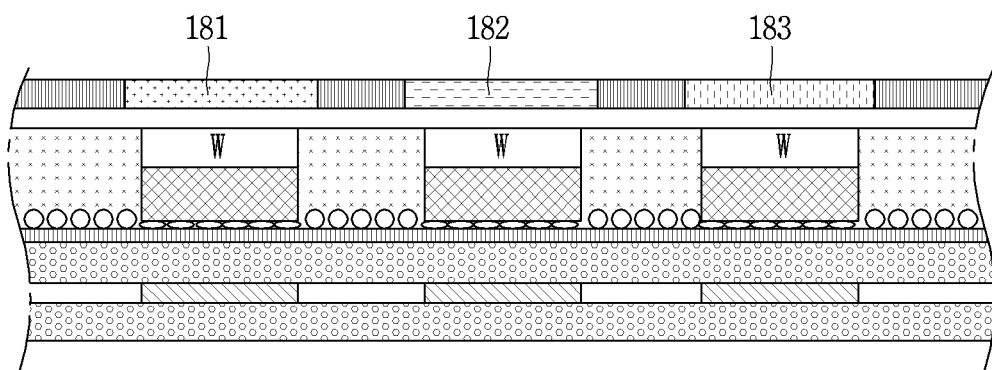

Referring to FIG. 5B, the semiconductor light-emitting element may have a white light-emitting element (W) provided with a yellow phosphor layer for each element. In this case, a red phosphor layer 181, a green phosphor layer 182 and blue phosphor layer 183 may be provided on the white light-emitting element (W) to implement a sub-pixel. Furthermore, a color filter repeated with red, green and blue on the white light-emitting element (W) may be used to implement a sub-pixel.

Figure 5C:
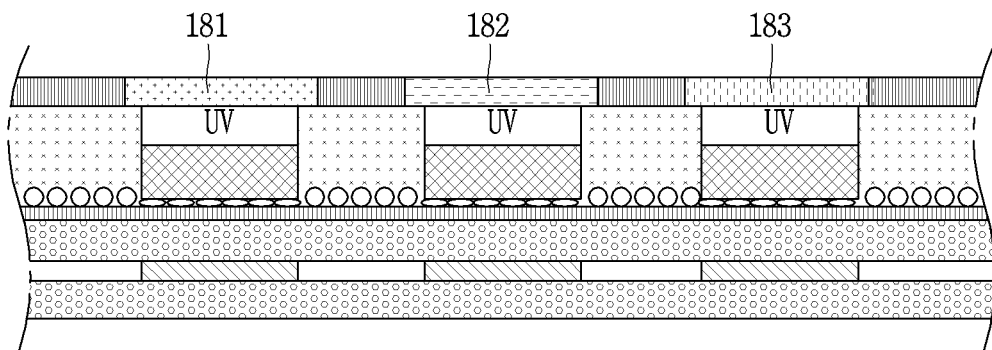

Referring to FIG. 5C, it may be possible to also have a structure in which a red phosphor layer 181, a green phosphor layer 182 and blue phosphor layer 183 may be provided on a ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to configure a sub-pixel in the display device. The semiconductor light-emitting element 150 has an excellent luminance characteristic, and thus it may be possible to configure individual sub-pixels even with a small size thereof. The size of the individual semiconductor light-emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having a HD image quality.

A display device using the foregoing semiconductor light-emitting element will be fabricated by a new type of fabrication method. Hereinafter, the fabrication method will be described with reference to FIG. 6.

Figure 6:
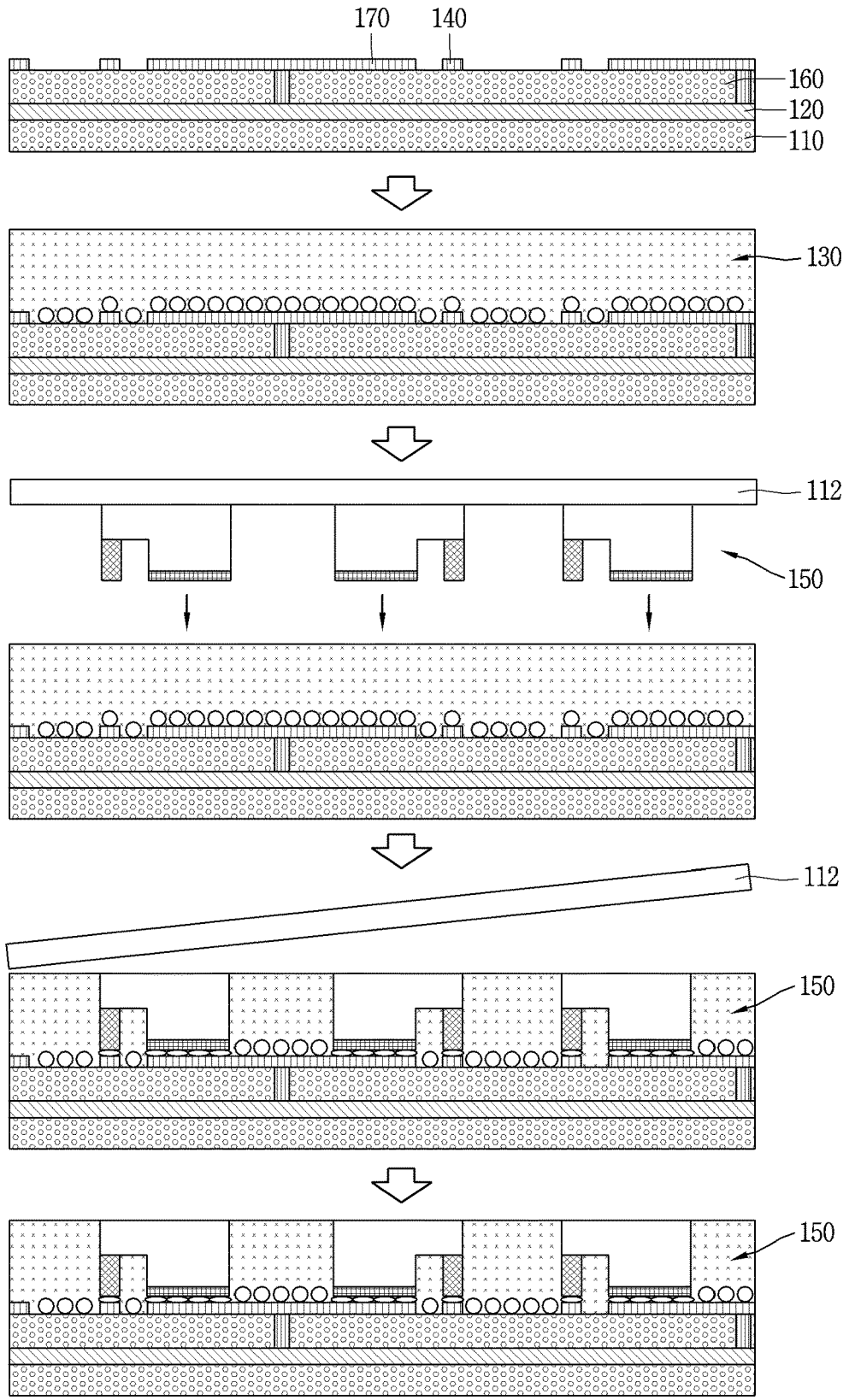
FIG. 6 is cross-sectional views illustrating a fabrication method of a display device using a semiconductor light-emitting element according to the present disclosure.

FIG. 6 is cross-sectional views illustrating a fabrication method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The fabrication method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
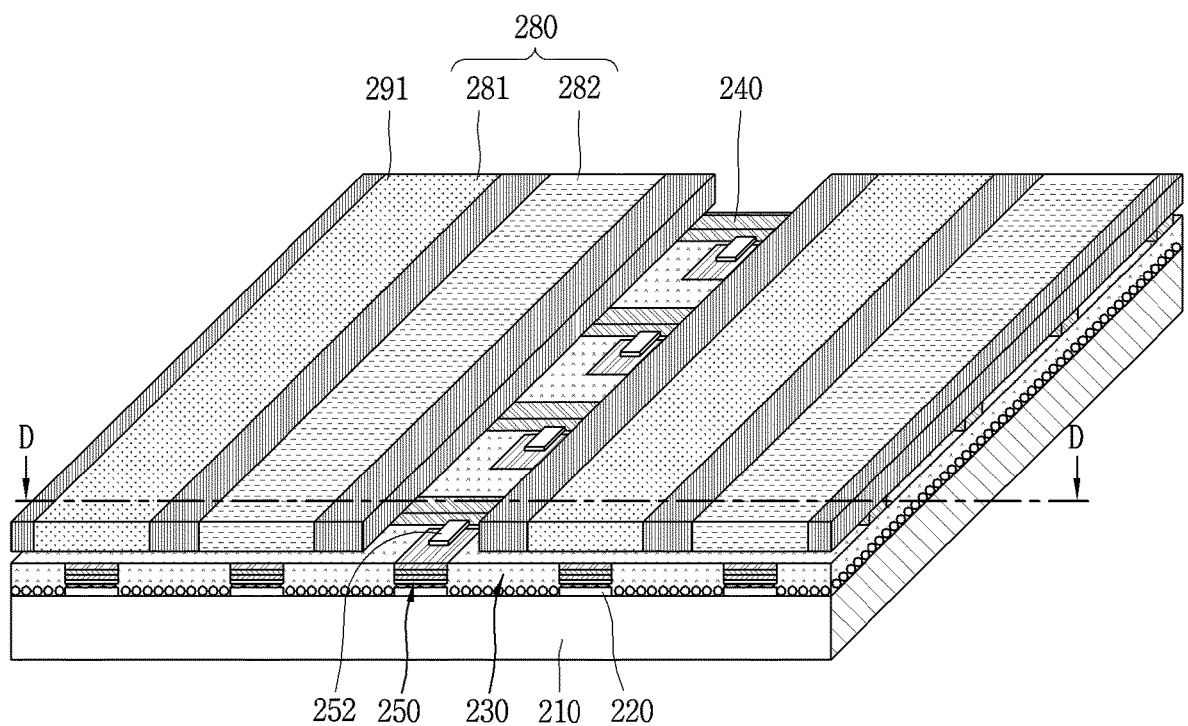
FIG. 7 is a perspective view illustrating a display device using a semiconductor light-emitting element according to another embodiment of the present disclosure.
Figure 8:
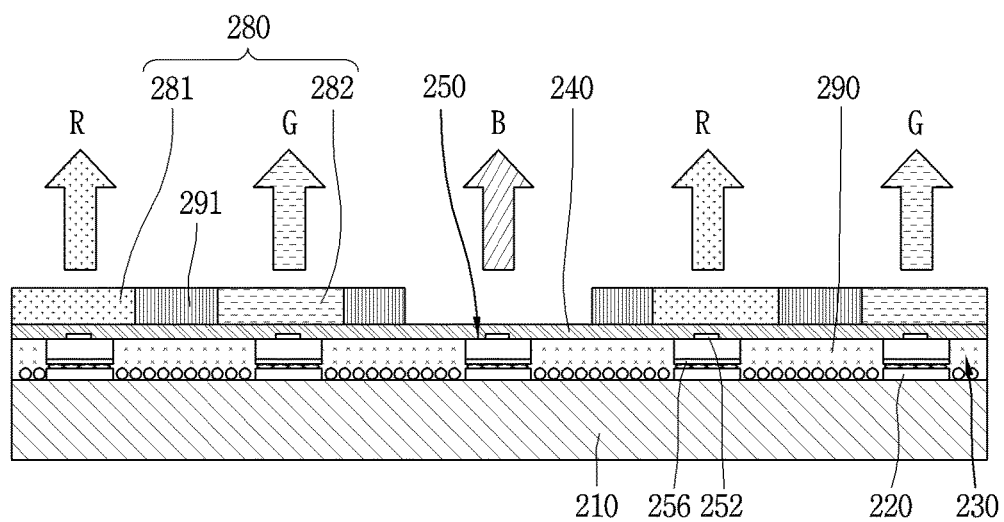
FIG. 8 is a cross-sectional view taken along line D-D in FIG. 7.
Figure 9:
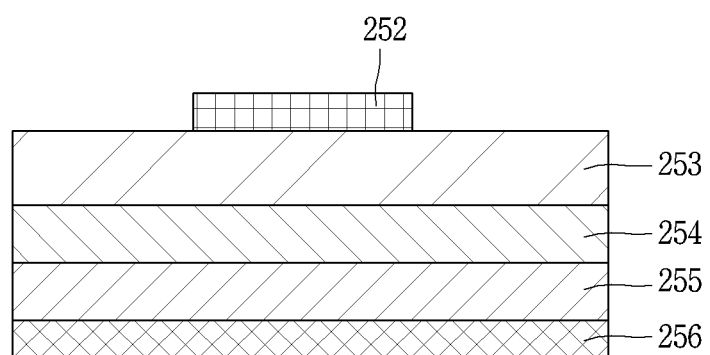
FIG. 9 is a conceptual view showing a vertical type semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 has an excellent luminance characteristic, and thus it may be possible to configure individual sub-pixels even with a small size thereof. The size of the individual semiconductor light-emitting element 250 may be less than 80 µm in the length of one side thereof, and formed with a rectangular or square shaped element. In case of a rectangular shaped element, the size thereof may be less than 20×80 µm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a location implementing a red sub-pixel, and a green phosphor 282 capable of converting blue light into green (G) light may be deposited on the blue semiconductor light-emitting element 251 at a location implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting element is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting elements 250, the partition wall 290 may be located between the semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

In this manner, the semiconductor light-emitting element 250 is placed on the conductive adhesive layer 230, thereby configuring a separate sub-pixel in the display device. The semiconductor light-emitting element 250 has an excellent luminance characteristic, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

In a display using the foregoing semiconductor light-emitting element of the present disclosure, a semiconductor light-emitting element grown on a growth substrate is transferred to a wiring substrate using an anisotropic conductive film (ACF). However, such a method has a disadvantage in that it is difficult to secure fabrication reliability and its fabrication cost is high. In particular, in a case of digital signage, the property of flexibility may not be required, and thus a different approach may be required for a display using a semiconductor light-emitting element.

Hereinafter, in order to overcome the foregoing technical difficulties and implement a high-resolution display based on an ultra-small micro light emitting diode, the present disclosure proposes a pixel structure for a display based on an ultra-small blue light emitting diode.

More specifically, a display device in which as semiconductor light-emitting elements are disposed in receiving holes on a planarization layer, the alignment of the semiconductor light-emitting elements is facilitated to allow the high-precision manufacture of a display device as well as to simplify wiring process through a height adjustment layer is presented.

Hereinafter, a display device according to another embodiment of the present disclosure capable of facilitating alignment and simplifying wiring process will be described in detail with reference to the drawings.

Figure 10:
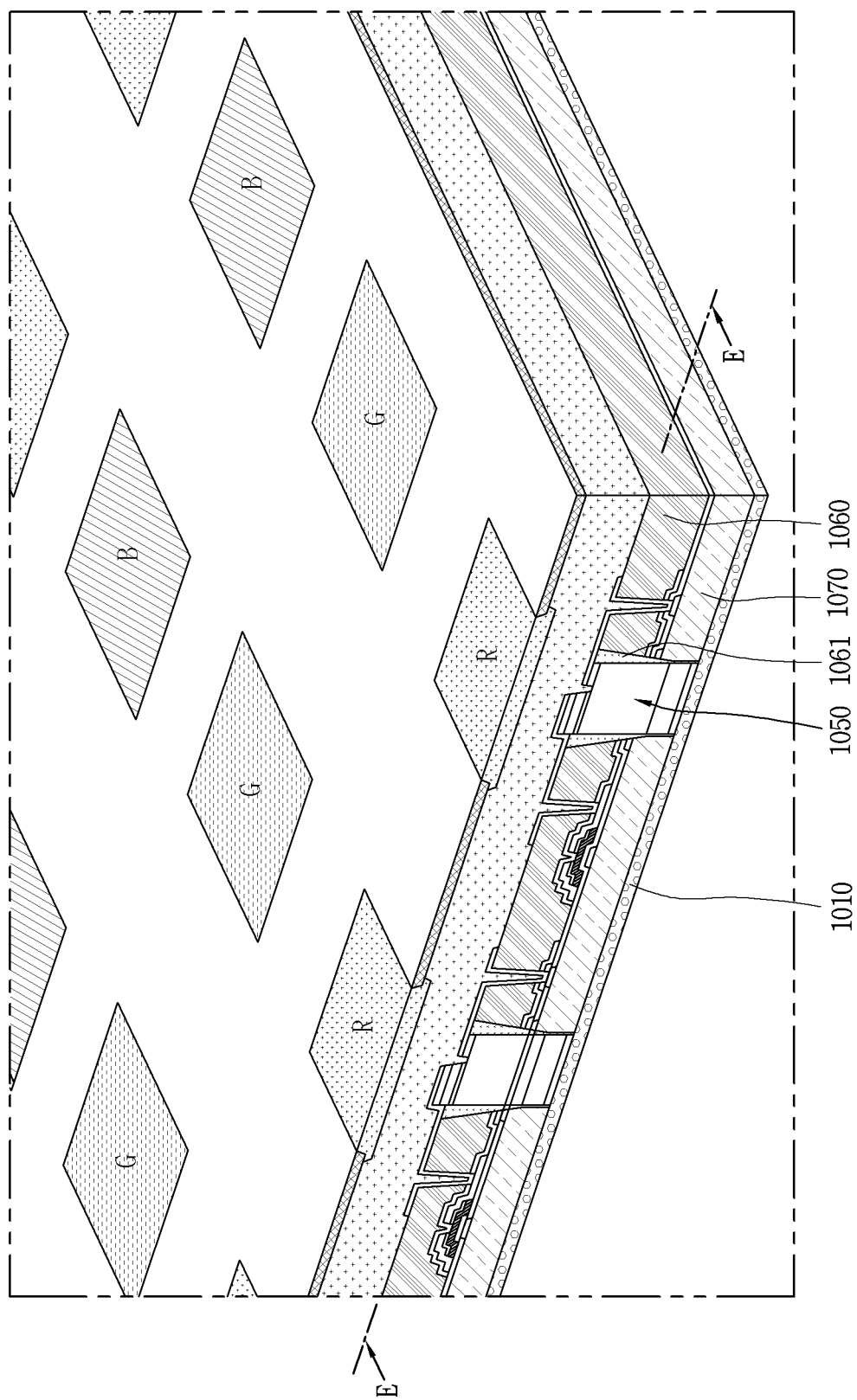
FIG. 10 is a partial perspective view for explaining another embodiment of the present disclosure.
Figure 11:
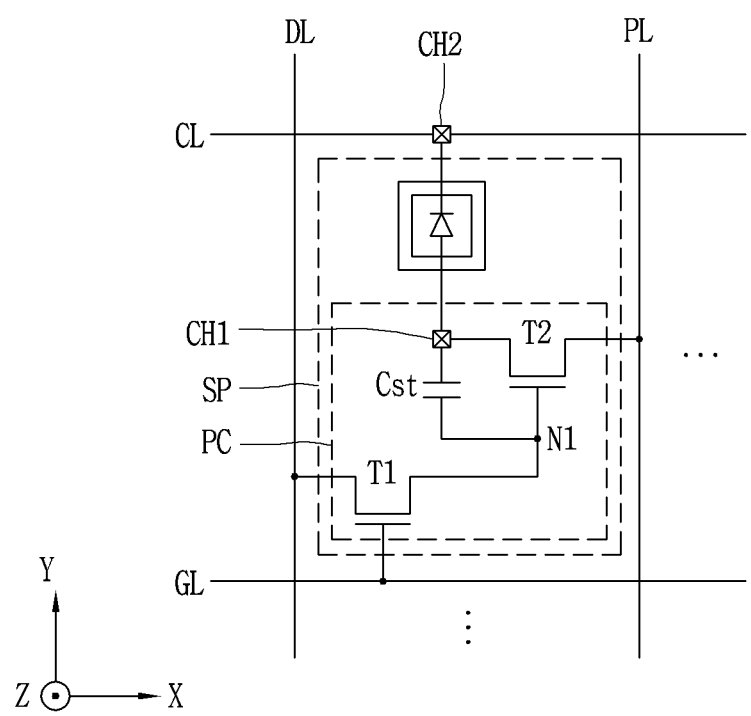
FIG. 11 is a cross-sectional view taken along line E-E in FIG. 10.
Figure 12:
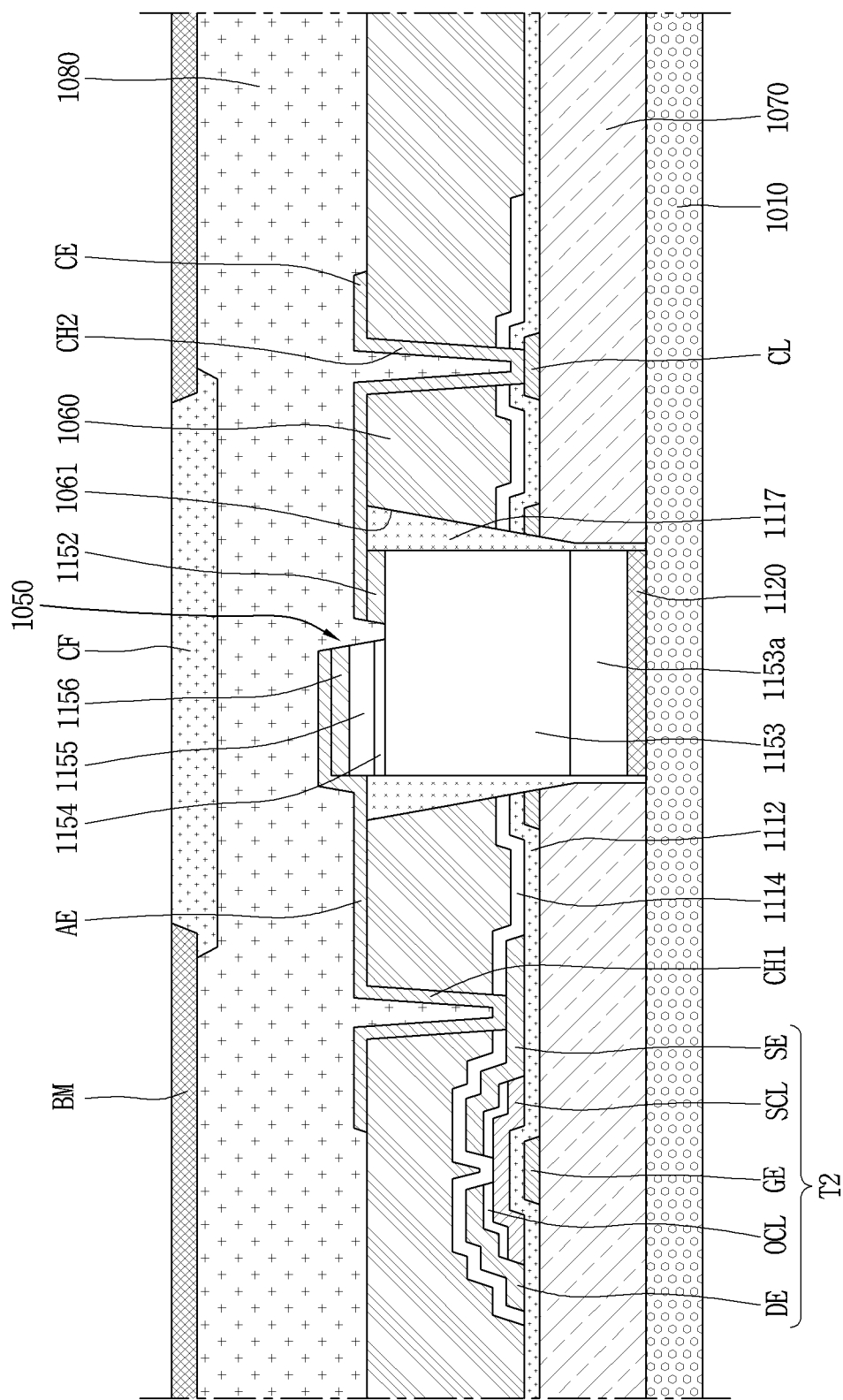
FIG. 12 is a circuit diagram for explaining the configuration of a pixel illustrated in FIG. 10.

FIG. 10 is a partial perspective view for explaining another embodiment of the present disclosure, and FIG. 11 is a cross-sectional view taken along line E-E in FIG. 10, and FIG. 12 is a circuit diagram for explaining the configuration of a pixel illustrated in FIG. 10.

According to the illustrations in FIGS. 10, 11 and 12, there is illustrated a display device 1000 using active matrix (AM) type semiconductor light-emitting element as a display device 1000 using a semiconductor light-emitting element. However, an example described below may also be applicable to a passive matrix (PM) type semiconductor light-emitting element.

According to the illustration, a display device 1000 using an active matrix semiconductor light-emitting element as a display device 1000 using a semiconductor light-emitting element is shown.

The display device 1000 includes a substrate 1010 and a plurality of semiconductor light-emitting elements 1050.

The substrate 1010 is a thin-film-transistor array substrate, and may be made of glass or a plastic material.

The substrate may include a display region and a non-display region. In this case, the display region may be defined as a portion except for an edge portion of the substrate 1010, and a region where a pixel array for displaying an image is disposed. The non-display region may be provided in a remaining portion except for the display region on the substrate 1010, and may be defined as an edge portion of the substrate 1010 surrounding the display region.

Furthermore, the substrate 1010 may include a plurality of gate lines (GL), a plurality of data lines (DL), a plurality of driving power lines (PL), a plurality of common power lines (CL) and a plurality of pixels (SP).

Each of the plurality of gate lines (GL) is provided on the substrate 1010, and extended along one direction of the substrate 1010, and spaced apart from the other direction crossing the one direction. The plurality of data lines (DL) are provided on the substrate 1010 so as to intersect the plurality of gate lines (GL), and extended along the other direction, and spaced apart at regular intervals along the one direction.

The plurality of driving power lines (PL) may be disposed in parallel with each of the plurality of data lines (DL), and formed with each of the plurality of data lines (DL). Each of the plurality of driving power lines (PL) supplies pixel driving power provided from the outside to the adjacent pixels (SP).

The plurality of common power lines (CL) may be provided on the substrate 1010 so as to be parallel to each of the plurality of gate lines (GL), and may be formed together with each of the plurality of gate lines (GL). Each of the plurality of common power lines (CL) supplies common power provided from the outside to the adjacent pixels (SP).

Each of the plurality of pixels (SP) is provided in a pixel region defined by the gate line (GL) and the data line (DL). Each of the plurality of pixels (SP) may be defined as a sub-pixel, which is a minimum unit area that emits actual light. The sub-pixel includes a single semiconductor light-emitting element as a minimum unit area that emits actual light. At least three adjacent pixels may constitute a single unit pixel for color display. For example, a single unit pixel includes a red pixel, a green pixel, and a blue pixel adjacent to each other, and may further include a white pixel for improving brightness.

The plurality of semiconductor light-emitting elements 1050 may have the foregoing structure with reference to FIG. 4, and may be mostly formed of gallium nitride (GaN), and indium (In) and/or aluminum (Al) may be added thereto to implement a high-power light-emitting element that emits blue light. For such an example, the plurality of semiconductor light-emitting elements 1050 may be gallium nitride thin layers formed with various layers, such as n-Gan, p-Gan, AlGaN, InGan, and the like. However, the present disclosure may not be necessarily limited thereto, and the plurality of semiconductor light-emitting elements may be implemented as light-emitting elements that emit green light. In addition, the semiconductor light-emitting element may be a micro light emitting diode chip. Here, the micro light emitting diode chip may have a cross-sectional area smaller than that of the light emitting region in the sub-pixel, and may have a scale of 1 to 100 micrometers, for such an example.

More specifically, the semiconductor light-emitting element includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 disposed to be spaced apart from the first conductive electrode 1156 in a horizontal direction on the second conductive semiconductor layer 1153. In this case, the second conductive electrode is disposed on one surface of the second conductive semiconductor layer 1153, and an undoped semiconductor layer 1153a is formed on the other surface of the second conductive semiconductor layer 1153.

Furthermore, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

In addition, according to another embodiment of the present disclosure, impurities may be implanted into an intrinsic or a doped semiconductor substrate to form the first and the second conductive semiconductor layer. Moreover, the region where a p-n junction is formed by the impurity implantation may serve as the active layer. The listed items of a first conductive semiconductor layer, a second conductive semiconductor layer, and an active layer, which will be described below, is merely exemplary and the present disclosure is not limited thereto.

Referring to these drawings, a planarization layer 1060 formed to cover the substrate, and provided with a receiving hole 1061 formed to accommodate the semiconductor light-emitting element may be formed on one surface of the substrate 1010.

For example, the planarization layer 1060 performs a role of a protective film covering the substrate and a function of covering wiring electrodes to form a flat surface, and is made of an insulating material. For such an example, furthermore, the planarization layer 1060 may include a photoresist, an optical polymer material, and other industrial plastic materials, and the like.

According to the illustration, the receiving hole 1061 may be provided in each of the plurality of pixels. The receiving hole 1061 is provided in a light emitting region defined in a sub-pixel to accommodate the semiconductor light-emitting element 1050. Each of the plurality of semiconductor light-emitting elements 1050 is connected to the pixel circuit (PC) of the corresponding pixel (SP), so as to emit light at a brightness proportional to a current flowing from the pixel circuit (PC), that is, the driving thin-film transistor (T2), to the common power line (CL).

In this case, the planarization layer 1060 is formed so as to cover the driving thin-film transistor (T2), and the receiving hole 1061 is recessed from the planarization layer 1060. The receiving hole 1061 is recessed from an upper surface of the planarization layer 1060 toward the substrate. For example, the receiving hole 1061 may have a cup shape having a size larger than the semiconductor light-emitting element 1050. Here, the receiving hole 1061 may be recessed on the planarization layer 1060 so as to have a depth larger than a thickness (or total height) of the semiconductor light-emitting element 1050.

According to the illustration, a first conductive electrode of the plurality of semiconductor light-emitting elements 1050 is connected to a source electrode of the driving thin-film transistor (T2) through a first contact hole (CH1), and connected to the common power line (CL) through a second contact hole (CH2).

In this example as described above, the semiconductor light-emitting element 1050 may be accommodated in the receiving hole 1061 recessed in the light emitting region of the pixel, and the electrodes of the semiconductor light-emitting element 1050 may be connected to the driving thin-film transistor in the pixel circuit through the contact holes (CH1, CH2), thereby simplifying the connection process of the semiconductor light-emitting element 1050.

According to the illustration, the driving thin-film transistor (T2) includes a gate electrode (GE), a semiconductor layer (SCL), an ohmic contact layer (OCL), a source electrode (SE), and a drain electrode (DE).

The gate electrode (GE) is formed together with the gate line (GL) on the substrate 2010. The gate electrode (GE) is covered by a gate insulating layer 1112.

The gate insulating layer 1112 may be formed of a single layer or a plurality of layers made of an inorganic material, and may be made of silicon oxide (SiOx), silicon nitride (SiNx), or the like.

The semiconductor layer (SCL) is provided in the form of a preset pattern (or island) on the gate insulating layer 2112 so as to overlap with the gate electrode (GE). The semiconductor layer (SCL) may be formed of a semiconductor material made of any one of amorphous silicon, polycrystalline silicon, an oxide, and an organic material, but is not limited thereto.

The ohmic contact layer (OCL) is provided on the semiconductor layer (SCL) in the form of a preset pattern (or island). Here, the ohmic contact layer (OCL) is for ohmic contact between the semiconductor layer (SCL) and the source/drain electrodes (SE, DE), and may be omitted.

The source electrode (SE) is formed on the other side of the ohmic contact layer (OCL) so as to overlap with one side of the semiconductor layer (SCL). The source electrode (SE) is formed together with a data line (not shown), and branched or protruded from an adjacent data line.

The drain electrode (DE) is formed on the other side of the ohmic contact layer (OCL) so as to be spaced apart from the source electrode (SE) while overlapping with the other side of the semiconductor layer (SCL). The drain electrode (DE) is formed together with a data line and a source electrode (SE).

An interlayer insulating layer 1114 is formed on an upper surface of the substrate 1010 so as to cover the pixel circuit including the driving thin-film transistor (T2). The interlayer insulating layer 1114 may be formed of an inorganic material such as silicon oxide (SiOx), silicon nitride (SiNx), or an organic material such as benzocyclobutene or photo acryl.

The planarization layer 1060 is formed on an upper surface of the substrate 1010 so as to cover the interlayer insulating layer 1114. This planarization layer 1060 protects the pixel circuit including the driving thin-film transistor (T2) while providing a flat surface on the interlayer insulating layer 1114. The planarization layer 1060 according to an example may be formed of an organic material such as benzocyclobutene or photo acryl.

In case of the photo acryl, the thickness is about 3 micrometers for one-time coating and the height of the semiconductor light-emitting element is about 5 to 10 micrometers, and thus the thickness of the second conductive semiconductor layer 1153 may be formed larger than that of the planarization layer 1060. Furthermore, in this case, the thickness of the first conductive semiconductor layer 1155 in the semiconductor light-emitting element may be smaller than that of the second conductive semiconductor layer 1153.

Here, a bottom surface of the receiving hole 1061 may be located in the planarization layer 1060, the interlayer insulating layer 1114, or the gate insulating layer 1112 according to the thickness of the semiconductor light-emitting element 1050. Moreover, the receiving hole 2061 may be formed by removing all the gate insulating layer 1112, the interlayer insulating layer 1114, and the planarization layer 1060, which overlap a light emitting region of the sub-pixel. The receiving hole 1061 may have a cup shape having a size larger than the semiconductor light-emitting element 1050.

Here, the first conductive electrode 1156 and the second conductive electrode 1152 of the semiconductor light-emitting element 1050 are separated from the bottom of the receiving hole 1061. According to the illustration, the first conductive electrode 1156 is connected to the source electrode (SE) of the driving thin-film transistor (T2), and the second conductive electrode 1152 is connected to the common power line (CL).

In this case, the semiconductor light-emitting element is formed to have a height higher than that of the planarization layer 1060. Furthermore, the first conductive electrode 1156 and the second conductive electrode 1152 may have a height difference with respect to the second conductive semiconductor layer 1153.

A height adjustment layer 1070 is formed between the substrate 1010 and the planarization layer 1060 so as to match the height of one surface of the planarization layer 1060 to either one of the first conductive electrode 1156 and the second conductive electrode 1152. The height adjustment layer 1070 may be formed of a polymer and an oxide or nitrogen oxide.

More specifically, a conductive electrode at a relatively lower position with respect to the first conductive electrode 1156 and the second conductive electrode 1152 may be positioned on the same horizontal line as an upper surface of the planarization layer 1060. For such an example, the height adjustment layer 1070 may be formed on the substrate to adjust a distance from the substrate to an upper surface of the planarization layer 1060. As described above, in the present disclosure, a step between transferred semiconductor light-emitting elements and the planarization layer is removed through the height adjustment layer, thereby facilitating the electrode connection process.

According to the illustration, the receiving hole 1061 passes through the height adjustment layer 1070 in addition to the planarization layer 1060 and the insulating layer 1112 such that an upper surface of the substrate forms the bottom of the receiving hole 1061. Accordingly, the receiving hole 1061 may be a closed hole. The semiconductor light-emitting element is attached to an upper surface of the substrate 1010 in the receiving hole 1061.

According to the illustration, each of the plurality of sub-pixels may include a pixel electrode pattern (AE) and a common electrode pattern (CE).

The pixel electrode pattern (AE) electrically connects the source electrode (SE) of the driving thin-film transistor (T2) to the first conductive electrode 1156 of the semiconductor light-emitting element 1050. The pixel electrode pattern (AE) according to an example is extended to the driving thin-film transistor (T2) through the first contact hole (CH1) provided in the planarization layer 1060, and connected to the first conductive electrode 1156 of the semiconductor light-emitting element 1050 while being connected to the source electrode (SE).

The common electrode pattern (CE) electrically connects the common power line (CL) to the second conductive electrode 1152 of the semiconductor light-emitting element 1050. The pixel electrode pattern (AE) according to an example is extended to the thin-film transistor (T2) through the second contact hole (CH2) provided in the planarization layer 1060, and connected to the second conductive electrode 1152 of the semiconductor light-emitting element 1050 while being connected to the common power line (CL).

Each of the pixel electrode pattern (AE) and the common electrode pattern (CE) may be formed of a transparent conductive material. The transparent conductive material may be made of a material such as indium tin oxide (ITO) or indium zinc oxide (IZO), but is not limited thereto.

In this example, the substrate 1010 further includes an adhesive layer 1120 that fixes the semiconductor light-emitting element 2050 to the receiving hole 1061.

The adhesive layer 1120 is interposed between the semiconductor light-emitting element 1050 and a bottom surface of the receiving hole 1061 to attach the semiconductor light-emitting element 1050 to a bottom surface of the receiving hole 1061. In this case, the adhesive layer 1120 may be formed of a material having light transmittance and adhesiveness. Since the adhesive layer is light transmissive, light emitted from the semiconductor light-emitting element may be emitted to a lower portion of the semiconductor light-emitting element.

The substrate 1010 may further include a filler 1117 filled around the semiconductor light-emitting element 1050 disposed in the receiving hole 1061.

The filler 1117 is filled into a surrounding space of the receiving hole 1061 to which the semiconductor light-emitting element 1050 is attached. The filler 1117 may be made of a thermosetting resin or a photocurable resin. The filler 1117 is filled into a surrounding space of the receiving hole 1061 and then cured to planarize an upper surface of the surrounding space of the receiving hole 1061 while removing an air gap in the receiving hole 1061. Furthermore, the filler 1117 may serve as a passivation layer of the semiconductor light-emitting element while supporting the pixel electrode pattern (AE) and the common electrode pattern (CE).

Referring to these drawings, a sealing layer 1080 covering an upper surface of the substrate 1010 may be provided in the display device according to the present example.

The sealing layer 1080 is coated on an upper surface of the substrate 1010 so as to cover the pixel (SP) and the light-emitting element 1050 to protect the pixel (SP) and the light-emitting element 1050 provided in the substrate 1010. The sealing layer 1080 may be formed of a thermosetting and/or photocurable resin, and thus coated on an upper surface of the substrate 1010 in a liquid phase, and then cured by a curing process using heat and/or light.

Meanwhile, the sealing layer 1080 may be replaced with a phosphor layer. The phosphor layer may include a first phosphor portion disposed at a position corresponding to a red pixel and a second phosphor portion disposed at a position corresponding to a green pixel. In this case, each of the first phosphor portion and the second phosphor portion is provided with a red phosphor and a green phosphor capable of converting the blue light of the blue semiconductor light-emitting element into red light or green light. Here, a light transmitting material that does not convert color may be disposed at a position forming a blue pixel. The light transmitting material is a material having a high transmittance in a visible light region, and an epoxy-based PR (photoresist), PDMS (polydimethylsiloxane), resin or the like may be used, for example.

For another example, the first phosphor portion and the second phosphor portion may be provided with a yellow phosphor capable of converting the blue light of the blue semiconductor light-emitting element into yellow light or white light. In this case, yellow light or white light may be converted into red, green and blue while passing through a color filter.

Furthermore, according to the illustration, the black matrix (BM) and the color filter layer (CF) may be disposed on the sealing layer 1080 (or the phosphor layer).

The black matrix (BM) defines an opening region overlapping with a light emitting region of each pixel (SP) provided on the substrate 1010. In other words, the black matrix (BM) is provided in the remaining region except for the opening region overlapping with the light emitting region of each pixel (SP), thereby preventing color mixture between adjacent opening regions.

A color filter layer (CF) may be disposed in the opening region. For example, when the light-emitting element 1050 disposed in each pixel (SP) emits blue light to be converted into white light by the yellow phosphor layer, red or green may be implemented on the color filter layer (CF). In this case, the color filter layer (CF) may have a structure in which portions for filtering the red wavelengths, the green wavelengths, and the blue wavelengths of light are sequentially arranged in each sub-pixel. In addition, the color filter layer (CF) may be disposed in the opening region to improve the color purity of the output light regardless of the color of the emitted light.

For another example, the color filter layer (CF) may be replaced by a light extraction layer. The light extraction layer is made of a transparent material to perform the role of extracting light emitted from the light-emitting element 1050 to the outside. An opposite surface of the light extraction layer facing the light-emitting element 1050 may have a lens shape for increasing the linearity of light emitted from the light-emitting element 1050.

According to the display device according to the present disclosure illustrated above, as the semiconductor light-emitting element is electrically connected to wiring in the receiving hole, the alignment of the semiconductor light-emitting element may be facilitated through the height adjustment layer to eliminate or reduce a height difference between the semiconductor light-emitting element and the planarization layer, thereby achieving simple electrode connection.

Meanwhile, the display device described above may be modified into various forms. Hereinafter, such modification examples will be described in more detail with reference to the drawings.

Figure 13:
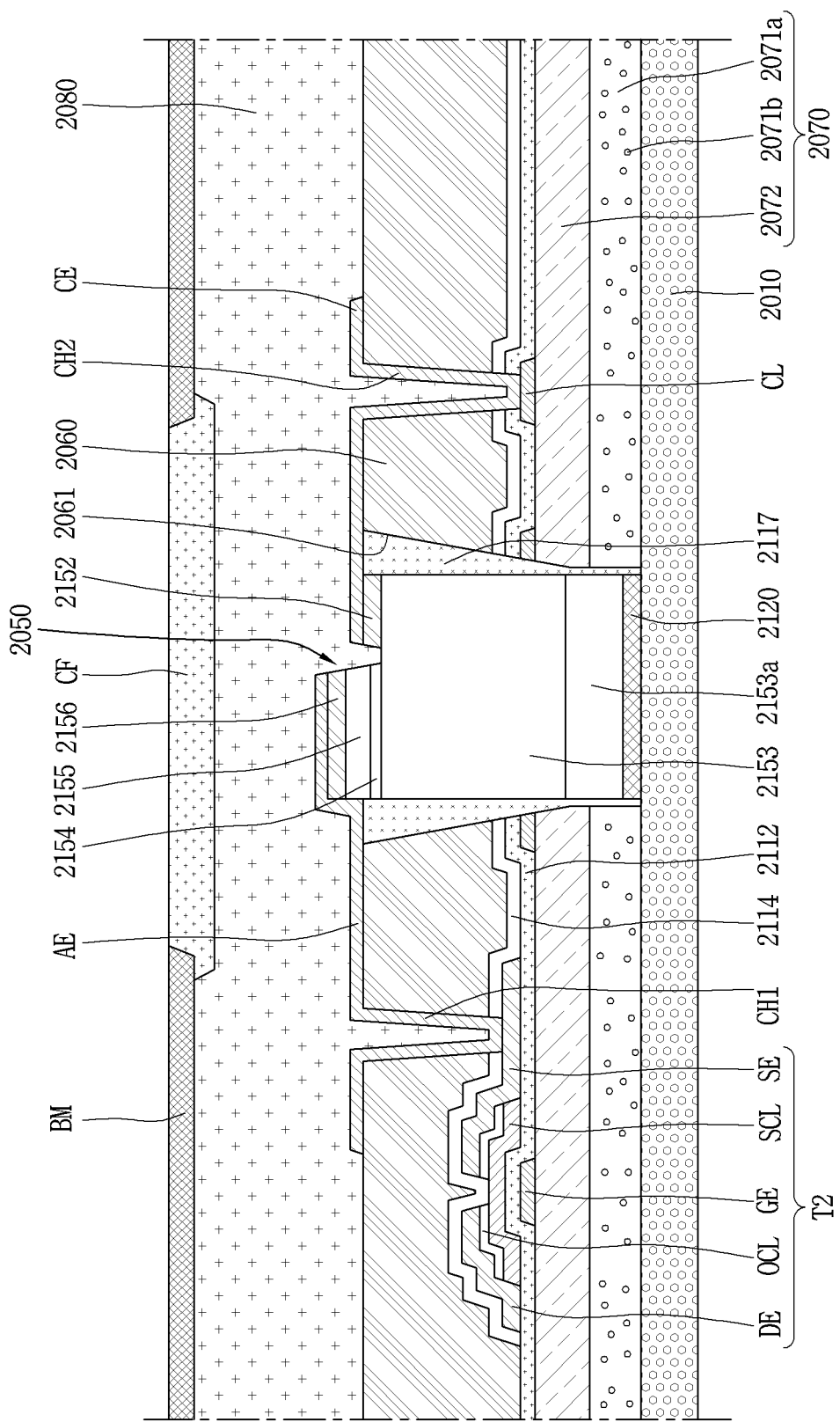
FIGS. 13, 14 and 15 are cross-sectional views showing still other embodiments of the present disclosure.
Figure 14:
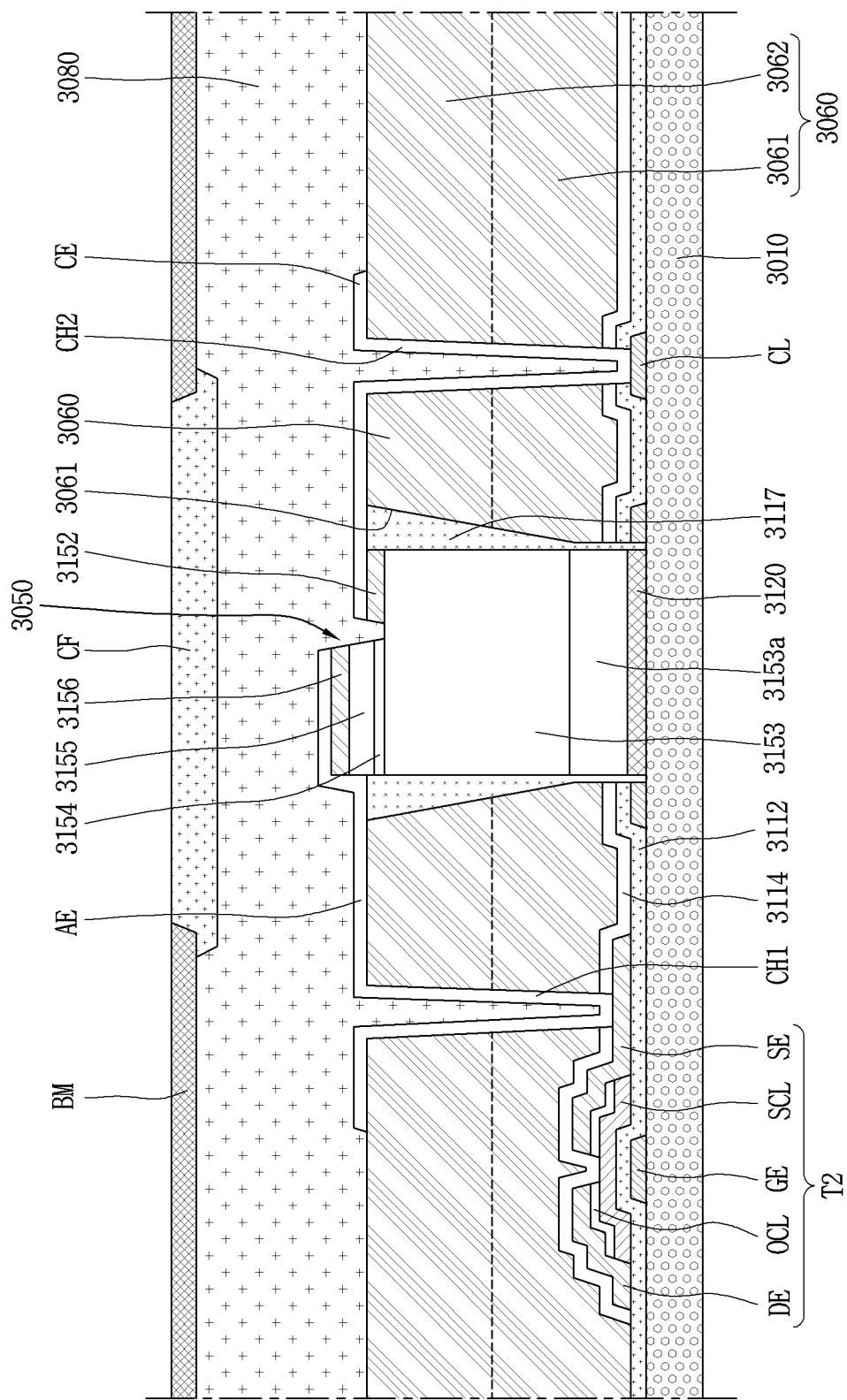
Figure 15:
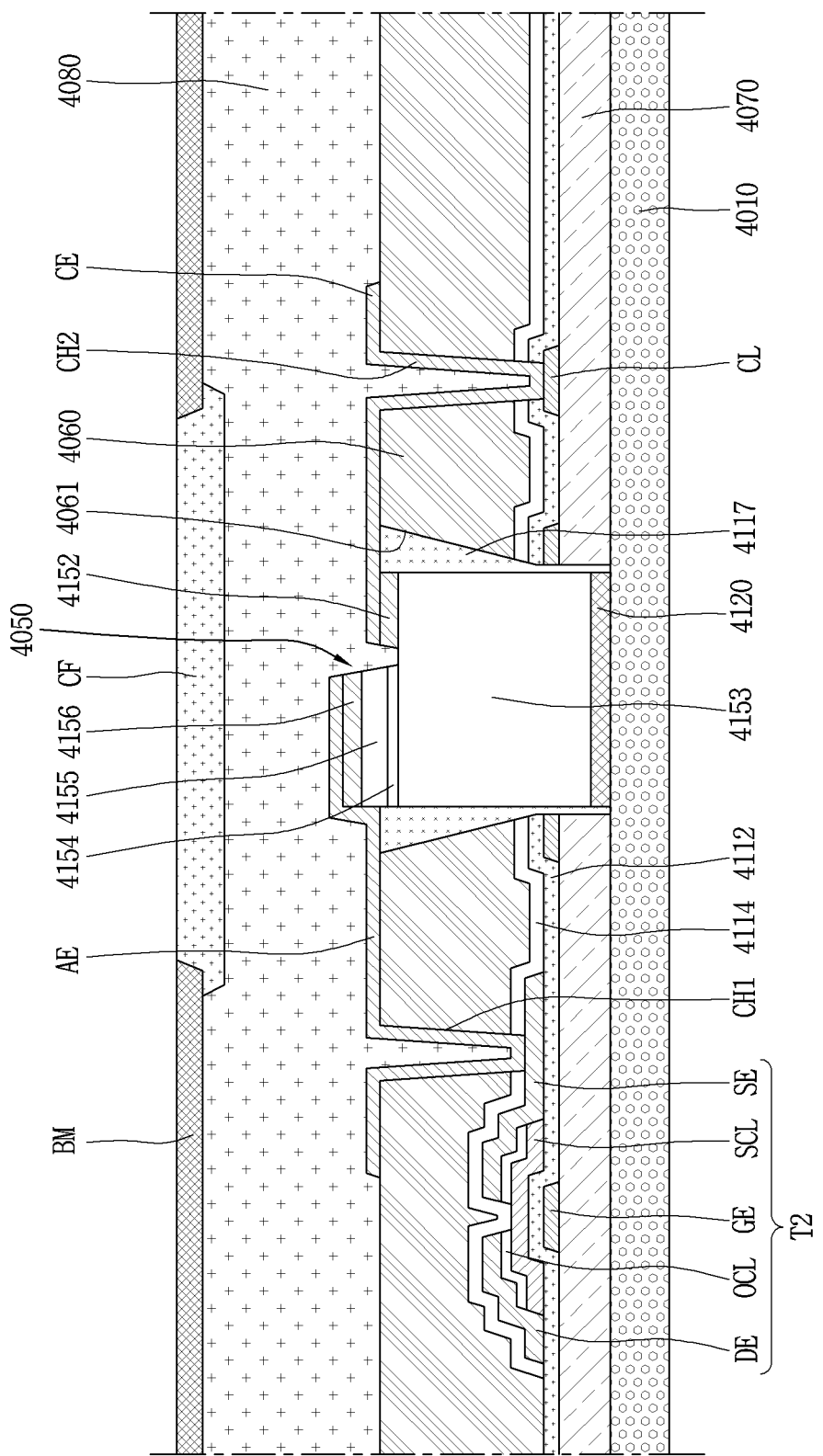

FIGS. 13, 14 and 15 are cross-sectional views showing still other embodiments of the present disclosure.

In an example of FIG. 13, the same reference numerals are designated to the same components as those of the example described above with reference to FIGS. 10 through 12, and the description thereof will be substituted by the earlier description. Specifically, the remaining configurations except for the height adjustment portion are the same as those of the example described in FIGS. 10 through 12.

Referring to the present drawing, the height adjustment layer may include a plurality of layers 2071, 2072 with different materials. In addition, either one of the layers 2071, 2072 may be implemented as a mirror layer reflecting light.

For example, the height adjustment layer may include a first layer 2071 deposited on the substrate and a second layer 2072 deposited on the first layer 2071. In this case, the first layer 2071 and the second layer 2072 may be formed of different materials.

More specifically, the first layer 2071 is a layer disposed on the substrate 2010, and configured to have an adhesive force to which the substrate 2010 is attached. Furthermore, the first layer 2071 is not a portion in direct contact with the thin-film transistor (T2) and thus may be provided with resin 2071a and reflective particles 2071b mixed into the resin 2071a. The first layer 2071 includes the reflective particles 2071b to reflect light emitted from the semiconductor light-emitting elements 2050.

In this case, the reflective particles as may include at least one of titanium oxide, alumina, magnesium oxide, antimony oxide, zirconium oxide, and silica as a white pigment. Furthermore, the resin 2071a may be formed of a material having good viscosity, adhesiveness, and fluidity.

Meanwhile, the second layer that is a layer deposited on the first layer 2071 may be a layer in which the reflective particles are not disposed. The most important function of the second layer 2072 is to improve its filling and adhesive properties due to the irregularities of the electrodes on the wiring board rather than the reflection effect, and thus the reflective particles are not added thereto.

However, the present disclosure is not necessarily limited thereto, and the second layer 2070 may also include a small amount of white pigment. In this case, a weight ratio of white pigment added to the second layer 2072 may be smaller than that added to the first layer 2071.

In an example of FIG. 14, the same reference numerals are designated to the same components as those of the example described above with reference to FIGS. 10 through 12, and the description thereof will be substituted by the earlier description. Specifically, the remaining configurations except for the planarization layer and the height adjustment layer are the same as those of the example described in FIGS. 10 through 12.

Referring to the present drawing, the planarization layer 3060 is formed on an upper surface of the substrate 3010 so as to cover the interlayer insulating layer 3114. This planarization layer 3060 protects the pixel circuit including the driving thin-film transistor (T2) while providing a flat surface on the interlayer insulating layer 3114. The planarization layer 1060 according to an example may be formed of an organic material such as benzocyclobutene or photo acryl.

In case of the photo acryl, the thickness may be about 3 micrometers for one-time coating and the height of the semiconductor light-emitting element may be about 5 to 10 micrometers. According to this example, since the photo acryl is coated a plurality of times, the planarization layer may form a plurality of layers 3061, 3062 with the same material. For example, a first layer 3061 is deposited on the substrate, and a second layer 3062 is deposited on the first layer 3061, and they may be formed of the same material.

As the planarization layer 3060 is formed of a plurality of layers with the same material, the planarization layer may have a height at which either one conductive electrode of a first conductive electrode 3156 and a second conductive electrode 3152 is disposed on the same plane as an upper surface of the planarization layer 3060. In this case, the above-mentioned height adjustment layer may be omitted.

For another example, the planarization layer 3060 may form a plurality of layers with different materials. For example, benzocyclobutene may be deposited on the substrate to form a first layer, and photo acryl may be deposited on the first layer to form a second layer.

In an example of FIG. 15, the same reference numerals are designated to the same components as those of the example described above with reference to FIGS. 10 through 12, and the description thereof will be substituted by the earlier description. Specifically, the remaining configurations except for the semiconductor light-emitting element and the height adjustment portion are the same as those of the example described in FIGS. 10 through 12.

Even in this example, as an example described with reference to FIG. 14, the height adjustment portion may be omitted, and a height of the semiconductor light-emitting element may be adjusted such that an upper surface of the planarization layer is disposed on the same plane as either one conductive electrode of the first conductive electrode 4156 and the second conductive electrodes 4152.

More specifically, the semiconductor light-emitting element includes a first conductive electrode 4156, a first conductive semiconductor layer 4155 formed with the first conductive electrode 4156, an active layer 4154 formed on the first conductive semiconductor layer 4155, a second conductive semiconductor layer 4153 formed on the active layer 4154, and a second conductive electrode 4152 disposed to be spaced apart from the first conductive electrode 4156 in a horizontal direction on the second conductive semiconductor layer 4153. In this case, an undoped semiconductor layer is not deposited on the other surface of the second conductive semiconductor layer 4153.

The undoped semiconductor layer may be removed by etching or the like after protecting the semiconductor light-emitting element in a laser lift-off (LLO) process of separating the light-emitting element. Furthermore, in this example, a height adjustment portion 4070 having a lower height than the height adjustment portion in an example described above with reference to FIGS. 10 through 12 may be formed.

In this case, the thickness of the second conductive semiconductor layer 4153 may be reduced, and the efficiency of the semiconductor light-emitting element may be increased, thereby reducing the height of the height adjustment portion 4070. Moreover, a structure without the height adjustment portion is also possible.

The configurations and methods according to the above-described embodiments will not be applicable in a limited way to a display device using the foregoing semiconductor light-emitting element, and all or part of each embodiment may be selectively combined and configured to make various modifications thereto.

What is the claimed is:

1. A display device, comprising:
    a substrate having a driving thin-film transistor;
    an insulating layer formed on the substrate covering the driving thin-film transistor;
    a semiconductor light-emitting element having a first conductive electrode and a second conductive electrode which are spaced apart in a horizontal direction; and
    a planarization layer formed to cover the driving thin-film transistor, and provided with a receiving hole for accommodating the semiconductor light-emitting element,
    wherein a height adjustment layer is formed between the substrate and the planarization layer to match a height of one surface of the substrate to either one of the first conductive electrode and the second conductive electrode,
    wherein the receiving hole passes through the planarization layer, the insulating layer, and the height adjustment layer, respectively, so that an upper surface of the substrate forms a bottom of the receiving hole, and
    wherein the semiconductor light-emitting element the upper surface of the substrate in the receiving hole.

2. The display device of claim 1, wherein the semiconductor light-emitting element is higher in height than the planarization layer.

3. The display device of claim 2, wherein the height adjustment layer is formed on the substrate to adjust a distance from the substrate to an upper surface of the planarization layer.

4. The display device of claim 2, wherein the height adjustment layer comprises a plurality of layers with different materials.

5. The display device of claim 2, wherein the height adjustment layer comprises a resin and reflective particles mixed into the resin.

6. The display device of claim 1, wherein the planarization layer comprises photo acryl coated to cover the insulating layer.

7. The display device of claim 6, wherein the planarization layer forms a plurality of layers by coating the photo acryl a plurality of times, and
    the plurality of layers are formed with the photo acryl.

8. The display device of claim 1, wherein a first conductive semiconductor layer of the semiconductor light-emitting element is smaller in thickness than a second conductive semiconductor layer.

9. The display device of claim 8, wherein a thickness of the second conductive semiconductor layer is greater than that of the planarization layer.

10. The display device of claim 1, further comprising:
    a pixel electrode pattern connected to the first conductive electrode and extended to the driving thin-film transistor through a first hole of the planarization layer; and a common electrode pattern connected to the second conductive electrode and extended to the driving thin-film transistor through a second hole of the planarization layer.

* * * * *